United States Patent [19]

Paulfus

[11] Patent Number: 4,674,521
[45] Date of Patent: Jun. 23, 1987

[54] RINSING APPARATUS AND METHOD

[75] Inventor: Bernard Paulfus, West Milford, N.J.

[73] Assignee: Machine Technology, Inc., Parsippany, N.J.

[21] Appl. No.: 735,872

[22] Filed: May 20, 1985

[51] Int. Cl.⁴ .............................................. B08B 3/02
[52] U.S. Cl. .................................. 134/167 R; 134/172; 118/52; 118/54; 239/247; 239/512; 239/752
[58] Field of Search ............... 134/150, 166 R, 167 R, 134/172, 183, 180, 154, 137, 140, 163, 176, 179, 149, 144, 145, 151, 153, 157, 33, 148; 118/52, 54; 239/225, 222.11, 231, 215, 232, 453, 247, 460, 178, 512, 186, 504; 494/23, 27

[56] References Cited

U.S. PATENT DOCUMENTS

| | | | |
|---|---|---|---|
| 1,631,404 | 6/1927 | Denison | 239/215 |
| 1,916,806 | 7/1933 | Myrick | 134/183 X |
| 2,726,666 | 12/1955 | Oxford | 134/181 X |
| 3,384,907 | 5/1968 | Lappin et al. | 239/222.11 X |
| 3,774,626 | 11/1973 | Schweitzer | 134/179 |
| 3,990,462 | 11/1976 | Elftmann | 134/140 X |
| 4,197,000 | 4/1980 | Blackwood | 134/140 X |

*Primary Examiner*—Harvey C. Hornsby
*Assistant Examiner*—Frankie L. Stinson
*Attorney, Agent, or Firm*—Lerner, David, Littenberg, Krumholz & Mentlik

[57] ABSTRACT

Rinsing methods and apparatus employ a rotatable work support to spray rinsing liquid against a surrounding wall of a processing station. The rinsing liquid washes residual processing liquid from the surrounding wall of the processing station, whereby the work support performs a cleaning function in addition to its conventional processing function.

15 Claims, 4 Drawing Figures

RINSING APPARATUS AND METHOD

FIELD OF THE INVENTION

The present invention relates to cleaning methods and apparatus, and, more particularly, to such methods and apparatus which are capable of rinsing a processing station after a processing operation has been performed therein.

BACKGROUND OF THE INVENTION

In the past, rotors have been used to generate a liquid spray. Although such rotors have been used in connection with pipe coaters (see U.S. Pat. No. 3,719,168), liquid atomizers (see U.S. Pat. No. 2,902,223) and dishwashers (see U.S. Pat. No. 3,444,870) in which the liquid can be sprayed indiscriminately into the air or onto articles, such as pipe interiors and dishes, they have not been used in environments in which the liquid cannot be sprayed indiscriminately.

SUMMARY OF THE INVENTION

In accordance with the present invention, a rotatable work support is used to spray rinsing liquid against a surrounding wall of a processing station, such as one used to carry out a photoresist deposition process during the manufacture of semiconductor devices from silicon wafers, in order to clean the wall. Because workpieces are supported on an upper surface of the work support before and after the rinsing operation, the rinsing liquid must be sprayed against the wall of the processing station without contacting the upper surface of the work support. If the rinsing liquid were allowed to contact the upper surface of the work support, it could have a detrimental affect on the next workpiece processed on the work support.

In accordance with one embodiment of the present invention, the work support is provided with an annular chamber and orifices extending from a peripheral edge of the work support to the annular chamber. By supplying rinsing liquid to the annular chamber as the work support rotates, the rinsing liquid is discharged by centrifugal force from the orifices in the form of a fan spray. The rinsing liquid impacts against the surrounding wall of the processing station to thereby clean the wall.

In an alternate embodiment of the present invention, the rinsing liquid is discharged against a solid lower surface of the work support as the work support rotates. Such an alternate embodiment creates basically the same fan spray of rinsing liquid as the other embodiment.

BRIEF DESCRIPTION OF THE DRAWINGS

For a better understanding of the present invention, reference is made to the following description of an exemplary embodiment of the invention considered in conjunction with the accompanying drawings, in which.

DESCRIPTION OF THE EXEMPLARY EMBODIMENT

Although the present invention is applicable to many different types of apparatus which require cleaning after a processing operation is carried out therein, it is especially suitable for use in connection with processing apparatus, such as those used to make semiconductor devices from silicon wafers. Accordingly, the present invention will be described in connection apparatus in which a photoresist deposition process is carried out during the manufacture of semiconductor devices from silicon wafers.

Figure 1:
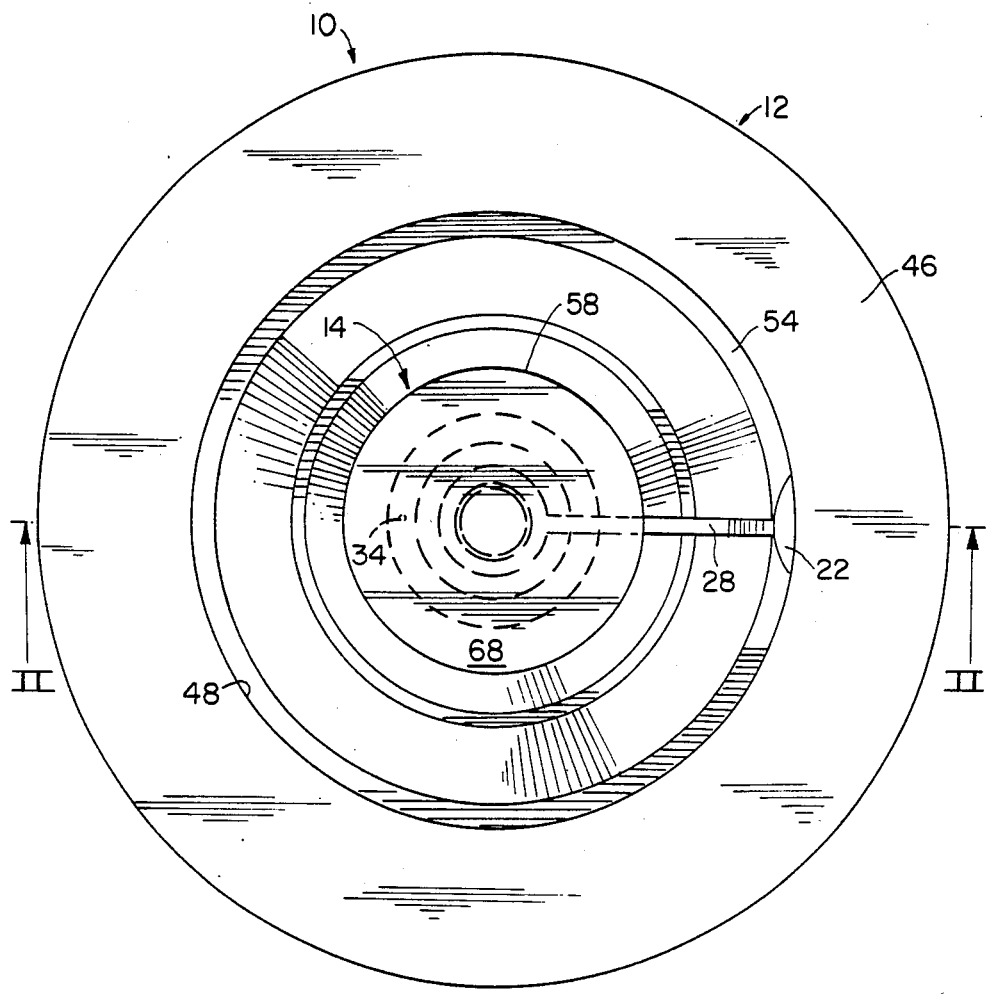
FIG. 1 is a plan view of a rinsing apparatus constructed in accordance with one embodiment of the present invention and adapted for use in connection with a photoresist deposition process carried out during the manufacture of semiconductor devices.
Figure 2:
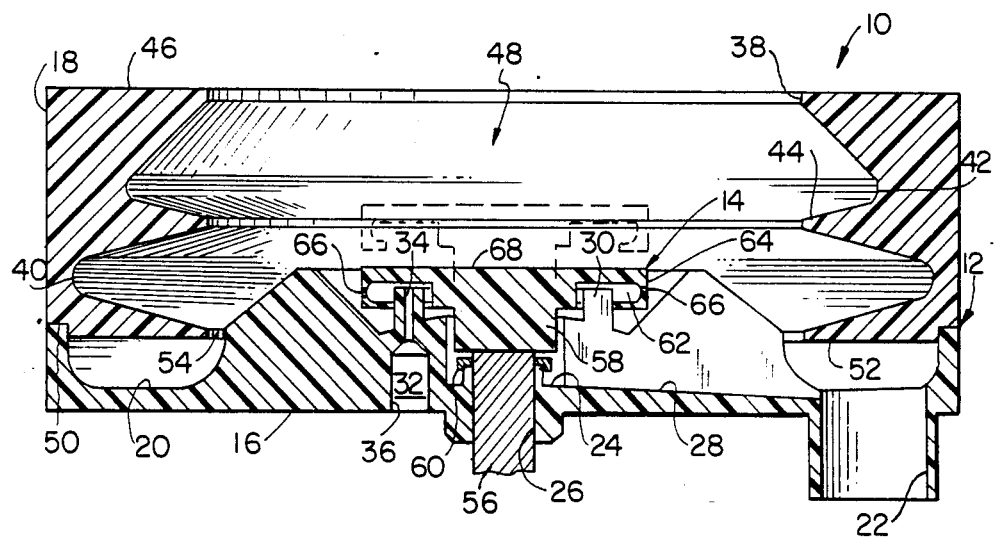
FIG. 2 is a cross-sectional view, taken along line II—II of FIG. 1 and looking in the direction of the arrows, of the rinsing apparatus illustrated in FIG. 1.

With reference to FIGS. 1 and 2, there is shown a processing station 10 adapted to perform a photoresist deposition process on silicon wafers from which semiconductor devices are to be made. The processing station includes a bowl assembly 12 and a chuck assembly 14. The following discussion contains a more detailed description of the bowl assembly 12 and the chuck assembly 14.

The bowl assembly 12 is formed from a base section 16 and a wall section 18. The base section 16 has an outer annular trough 20, which communicates with a drain 22, and an inner well 24, which is provided with a hole 26. A channel 28 connects the drain 22 with the well 24 for a purpose to be explained hereinafter in connection with the operation of the processing station 10. A circular flange 30 extends upwardly from the base section 16. The flange 30 is provided with a conduit 32 having a small diameter upper end 34 and a large diameter lower end 36 adapted to receive a fitting (not shown) for supplying a rinsing liquid under pressure to the upper end 34 of the conduit 32.

The wall section 18 has an inner sidewall 38 provided with a lower circular groove 40, an upper circular groove 42 and a circular rib 44 separating the lower groove 40 from the upper groove 42. The wall section 18 also includes an upper end 46, which is provided with an opening 48, and a lower end 50, which is provided with a lip 52. When the wall section 18 is seated on the base section 16, the lip 52 cooperates with the base section 16 to form an annular passageway 54 for a purpose to be explained hereinafter in connection with the description of the operation of the processing station 10.

The chuck assembly 14, which is movable between a retracted position (shown in solid lines in FIG. 2) and an extended position (shown in phantom in FIG. 2), includes a shaft 56, which is rotatably received in the hole 26 of the bowl assembly 12, and a chuck 58, attached to the shaft 56 for conjoint rotation therewith. A sealing ring 60 carried by the shaft 56 seals the hole 26. The chuck 58 is provided with an annular chamber 62 sized and shaped so as to receive the flange 30 of the bowl assembly 12 when the chuck assembly 14 is in its retracted position. A peripheral edge 64 of the chuck 58 has orifices 66 which extend from the peripheral edge 64 to the annular chamber 62 for a purpose to be explained hereinafter in connection with the description of the operation of the processing station 10. An upper surface 68 of the chuck 58 is adapted to receive a silicon wafer (not shown) to be processed.

In operation, a silicon wafer is deposited on the upper surface 68 of the chuck 58. With the chuck assembly 14 in its retracted position, a photoresist deposition process is carried out on the silicon wafer. During the performance of such a process, the chuck 58 is rotated causing the photoresist to be discharged by centrifugal force against the inner sidewall 38 of the bowl assembly 12. Most of the photoresist discharged against the inner sidewall 38 flows down through the passageway 54 and into the trough 20, from where the photoresist is removed by suction through the drain 22. However, some of the photoresist remains on the inner sidewall 38.

In order to rinse the photoresist from the inner sidewall 38 of the bowl assembly 12, the silicon wafer is removed from the upper surface 68 of the chuck 58 and the chuck assembly 14 is moved to its extended position in which the orifices 66 are arranged at substantially the same elevation as the rib 44. As the chuck 58 is rotated, a rinsing liquid is supplied under pressure to the conduit 32 such that the rinsing liquid is sprayed from the conduit 32 into the annular chamber 62 of the chuck 58. The rotation of the chuck 58 causes the rinsing liquid to be discharged from the orifices 66 in a fan spray directed at the lower groove 40, the upper groove 42 and the rib 44 of the bowl assembly 12, whereby the rinsing liquid sprayed from the orifices 66 rinses substantially the entire inner sidewall 38 of the bowl assembly 12. The rinsing liquid impacting against the inner sidewall 38 flows downwardly through the passageway 54 and into the trough 20 along with the photoresist removed from the inner sidewall 38. The rinsing liquid and the photoresist are removed from the trough 20 by suction through the drain 22. Any rinsing liquid and/or photoresist which collects in the well 24 flows through the channel 28 into the trough 20, from where the rinsing liquid and/or photoresist is removed by suction through the drain 22. At the conclusion of the rinsing operation, the processing station 10 is ready to repeat a photoresist deposition process on another silicon wafer.

Figure 3:
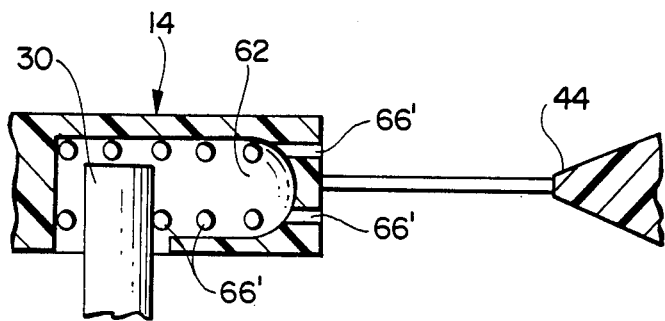
FIG. 3 is a partial cross-sectional view of a portion of the chuck assembly showing orifices arranged in an upper and lower set in accordance with another embodiment of the present invention.
Figure 4:
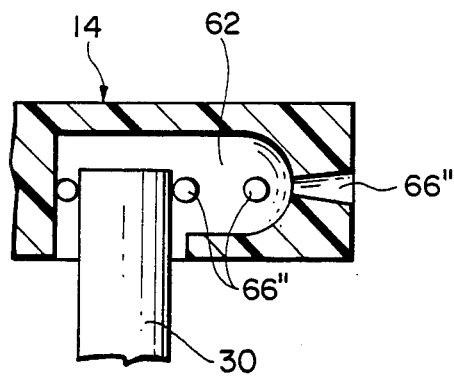
FIG. 4 is a partial cross-sectional view of a portion of the chuck assembly showing an orifice having a tapered cross-section.

It will be understood that the embodiment described herein is merely exemplary and that a person skilled in the art may make many variations and modifications without departing from the spirit and scope of the invention. For instance, the orifices 66″, as shown in FIG. 4, can be tapered (i.e., outwardly flared) so as to enhance the formation of the fan spray. Also, the orifices 66′, as shown in FIG. 3, can be provided in two sets, one set directing a fan spray into the lower groove 40 and the other set directing a fan spray into the upper groove 42 when the chuck assembly 14 is in its extended position. Such an orifice configuration ensures that substantially the entire inner sidewall 38 is contacted by the rinsing liquid discharged from the orifices 66. These and all other variations and modifications are intended to be included in the scope of the invention as defined in the appended claims.

I claim:

1. Apparatus for rinsing an inner wall of a processing station, said apparatus comprising a rotatable member having a chamber and surrounded by said inner wall for supporting a workpiece thereon during a processing operation, said rotatable member movable relative to said inner wall between a retracted position and an extended position, spraying means for spraying rinsing liquid from said rotatable member against said inner wall of said processing station as said rotatable member rotates, and supplying means for supplying said rinsing liquid to said chamber, said supplying means including a flange member extending into said chamber when said rotatable member is in its said retracted position and spaced from said chamber when said rotatable member is in its said extended position, said flange member including conduit means for supplying said rinsing liquid to said chamber when said rotatable member is in its said extended position.

2. The apparatus of claim 1, wherein said supplying means includes orifices provided in a peripheral edge of said rotatable member and communicating with said chamber such that rinsing liquid supplied to said chamber is discharged from said orifices in a fan spray.

3. The apparatus of claim 2, wherein said inner wall is circular and includes a lower circular groove, an upper circular groove, and a circular rib separating said lower circular groove from said upper circular groove.

4. The apparatus of claim 3, wherein said rotatable member is arranged at substantially the same elevation as said lower circular groove when in said retracted position and arranged at substantially the same elevation as said circular rib when in said extended position.

5. The apparatus of claim 4, wherein said supplying means supplies rinsing liquid to said chamber of said rotatable member when said rotatable member is in its said extended position, whereby said fan spray impacts against both said lower circular groove and said upper circular groove.

6. The apparatus of claim 5, wherein said orifices include an upper set positioned so as to spray rinsing liquid into said upper circular groove and a lower set positioned so as to spray rinsing liquid into said lower circular groove.

7. The apparatus of claim 2, wherein each of said orifices is tapered such that one end is narrow and an opposite end is wide, said one end communicating with said chamber of said rotatable member, whereby said tapered orifices enhance the formation of said fan spray.

8. The apparatus of claim 1, further comprising draining means for draining rinsing liquid from said processing station.

9. The apparatus of claim 8, wherein said draining means is the same drain used during the performance of said processing operation.

10. The apparatus of claim 1, wherein said rotatable member includes an uppr surface adapted to support a workpiece during said processing operation.

11. The apparatus of claim 10, wherein said rinsing liquid is sprayed against said inner wall of said processing station without contacting said upper surface of said rotatable member.

12. The apparatus of claim 1, wherein said processing operation is a photoresist deposition process carried out in connection with the manufacture of semiconductor devices from silicon wafers.

13. The apparatus of claim 1, wherein said chamber comprises an annular chamber.

14. The apparatus of claim 13, wherein said annular chamber receives a portion of said supplying means when said rotatable member is in said retracted position, whereby said rotatable member is rotatably relative to the received portion of said supplying means.

15. Apparatus for rinsing an inner wall of a processing station, said apparatus comprising a rotatable member surrounded by said inner wall and adapted to support a workpiece during a processing operation, said inner wall being circular and including a lower circular groove, an upper circular groove, and a circular rib separating said lower circular groove from said upper circular groove, said rotatable member movable relative to said inner wall between a retracted position in which said rotatable member is at substantially the same elevation as said lower circular groove and an extended position in which said rotatable member is at substantially the same elevation as said circular rib, spraying means for spraying rinsing liquid from said rotatable member against said inner wall of said processing station as said rotatable member rotates, said spraying means including an annular chamber provided within said rotatable member, supplying means for supplying said rinsing liquid to said annular chamber, and orifices provided in a peripheral edge of said rotatable member and communicating with said annular chamber such that rinsing liquid supplied to said annular chamber is discharged from said orifices in a fan spray, said supplying means supplying rinsing liquid to said annular chamber of said rotatable member when said rotatable member is in its said extended position, whereby said fan spray impacts against both said lower circular groove and said upper circular groove, said supplying means including a circular flange which extends into said annular chamber of said rotatable member when said rotatable member is in its said retracted position and which is spaced from said annular chamber when said rotatable member is in its said extended position, said circular flange including a conduit which supplies rinsing liquid under pressure to said annular chamber of said rotatable member when said rotatable member is in its said extended position.

* * * * *